(12) United States Patent
Tseng et al.

(10) Patent No.: US 10,707,135 B2
(45) Date of Patent: Jul. 7, 2020

(54) METHOD FOR FABRICATING SEMICONDUCTOR DEVICE (71) Applicant: UNITED MICROELECTRONICS CORP., Hsin-Chu (TW)

(72) Inventors: Kuan-Hao Tseng, Kaohsiung (TW); Chien-Ting Lin, Hsinchu (TW); Shih-Hung Tsai, Tainan (TW); Po-Kuang Hsieh, Kaohsiung (TW); Yu-Ting Tseng, Tainan (TW); Chueh-Fei Tai, Tainan (TW); Cheng-Ping Kuo, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/806,277

(22) Filed: Nov. 7, 2017

(65) Prior Publication Data
US 2019/0131183 A1 May 2, 2019

(30) Foreign Application Priority Data

Oct. 26, 2017 (CN) .......................... 2017 1 1012210

(51) Int. Cl.
| H01L 21/00 | (2006.01) |
| H01L 21/8238 | (2006.01) |
| H01L 21/308 | (2006.01) |
| H01L 21/306 | (2006.01) |
| H01L 21/02 | (2006.01) |
| H01L 27/092 | (2006.01) |
| H01L 29/165 | (2006.01) |
| H01L 21/3065 | (2006.01) |
| H01L 29/66 | (2006.01) |

(Continued)

(52) U.S. Cl.
CPC ................ *H01L 21/823821* (2013.01); *H01L 21/02532* (2013.01); *H01L 21/02636* (2013.01); *H01L 21/308* (2013.01); *H01L 21/3065* (2013.01); *H01L 21/30625* (2013.01); *H01L 21/823878* (2013.01); *H01L 21/823892* (2013.01); *H01L 27/0924* (2013.01); *H01L 27/0928* (2013.01); *H01L 29/165* (2013.01); *H01L 29/66795* (2013.01); *H01L 21/266* (2013.01); *H01L 21/26513* (2013.01); *H01L 21/76224* (2013.01); *H01L 29/167* (2013.01)

(58) Field of Classification Search
CPC ....... H01L 21/823821; H01L 21/02532; H01L 21/02636; H01L 21/30625; H01L 21/3065; H01L 21/308; H01L 21/76224; H01L 21/823878; H01L 21/823892; H01L 27/0924; H01L 27/0928; H01L 29/165
See application file for complete search history.

(56) References Cited

U.S. PATENT DOCUMENTS

| 8,329,564 B2 | 12/2012 | Cai et al. |
| 8,575,708 B2 | 11/2013 | Lin |

(Continued)

*Primary Examiner* — Kimberly N Rizkallah
*Assistant Examiner* — Alexander Belousov
(74) *Attorney, Agent, or Firm* — Winston Hsu (57) ABSTRACT

A method for fabricating semiconductor device includes the steps of: providing a substrate having a first region and a second region; forming a first well in the substrate on the first region and a second well in the substrate on the second region; removing part of the first well to form a first recess; and forming a first epitaxial layer in the first recess.

13 Claims, 6 Drawing Sheets

(51) Int. Cl.
  *H01L 29/167* (2006.01)
  *H01L 21/762* (2006.01)
  *H01L 21/266* (2006.01)
  *H01L 21/265* (2006.01)

(56) References Cited

U.S. PATENT DOCUMENTS

| | | |
|---|---|---|
| 9,054,219 B1 * | 6/2015 | Hoffmann ....... H01L 21/823431 |
| 2013/0105914 A1 * | 5/2013 | Lin .................. H01L 29/66795 |
| | | 257/402 |
| 2017/0278972 A1 * | 9/2017 | Hsia ................. H01L 29/66818 |
| 2018/0315753 A1 * | 11/2018 | Balakrishnan ...... H01L 27/0886 |

* cited by examiner

METHOD FOR FABRICATING SEMICONDUCTOR DEVICE

BACKGROUND OF THE INVENTION

1. Field of the Invention

The invention relates to a method for fabricating semiconductor device, and more particularly, to a method of forming recess in a substrate, growing an epitaxial layer in the recess, and then forming the epitaxial layer into fin-shaped structures.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, the design of fin-shaped structure in current FinFET fabrication still resides numerous bottlenecks which induces current leakage of the device and affects overall performance of the device. Hence, how to improve the current FinFET fabrication and structure has become an important task in this field.

SUMMARY OF THE INVENTION

According to an embodiment of the present invention, a method for fabricating semiconductor device includes the steps of: providing a substrate having a first region and a second region; forming a first well in the substrate on the first region and a second well in the substrate on the second region; removing part of the first well to form a first recess; and forming a first epitaxial layer in the first recess.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
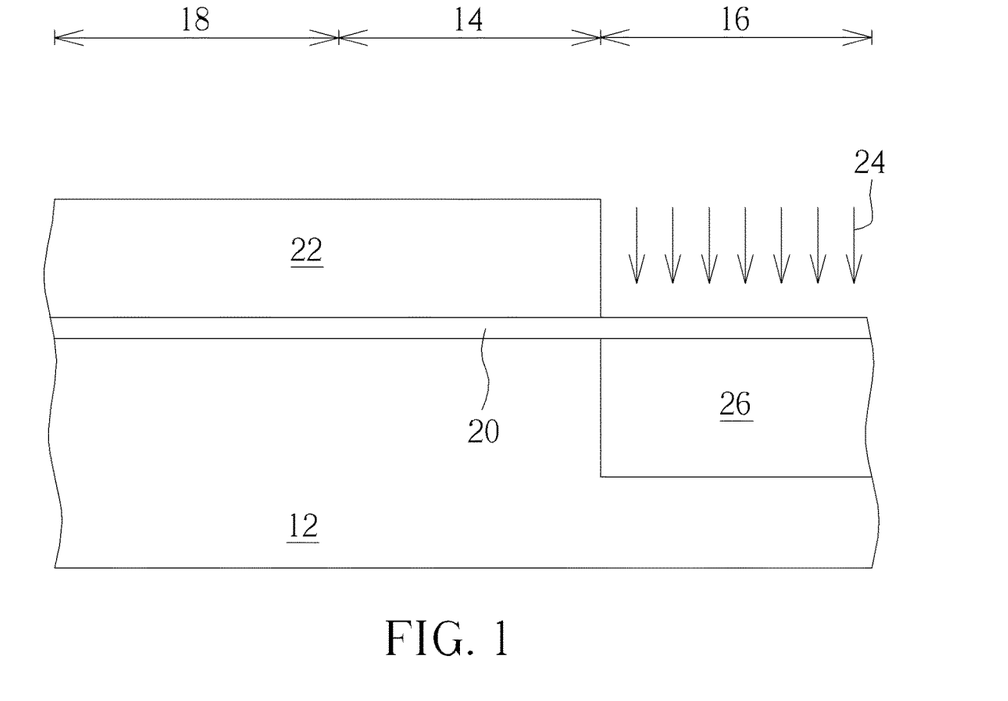
FIGS. 1-11 illustrate a method for fabricating semiconductor device according to an embodiment of the present invention.

Referring to FIGS. 1-11, FIGS. 1-11 illustrate a method for fabricating semiconductor device according to an embodiment of the present invention. As shown in FIG. 1, a substrate 12 such as a silicon substrate is provided, and a first region, a second region, and a third region are defined on the substrate 12. In this embodiment, the first region is preferably a NMOS region 14 used for fabricating NMOS transistors in the later process, the second region is preferably a PMOS region 16 used for fabricating PMOS transistors, and the third region is preferably a peripheral region 18. Next, a pad layer 20 made of material including but not limited to for example silicon oxide is formed on the substrate 12, and a first well is formed in the substrate 12 on NMOS region 14 and a second well is formed in the substrate 12 on PMOS region 16.

In this embodiment, the formation of the first well and the second well could be accomplished by first forming a patterned mask, such as a patterned resist 22 on the pad layer 20 to cover the NMOS region 14 and the peripheral region 18, and an ion implantation process 24 is conducted by using the patterned resist 22 as mask to implant n-type dopants such as phosphorus (P) or arsenic (As) into the substrate 12 on PMOS region 16 to form a second well or n-well 26. The patterned resist 22 is removed thereafter.

Figure 2:
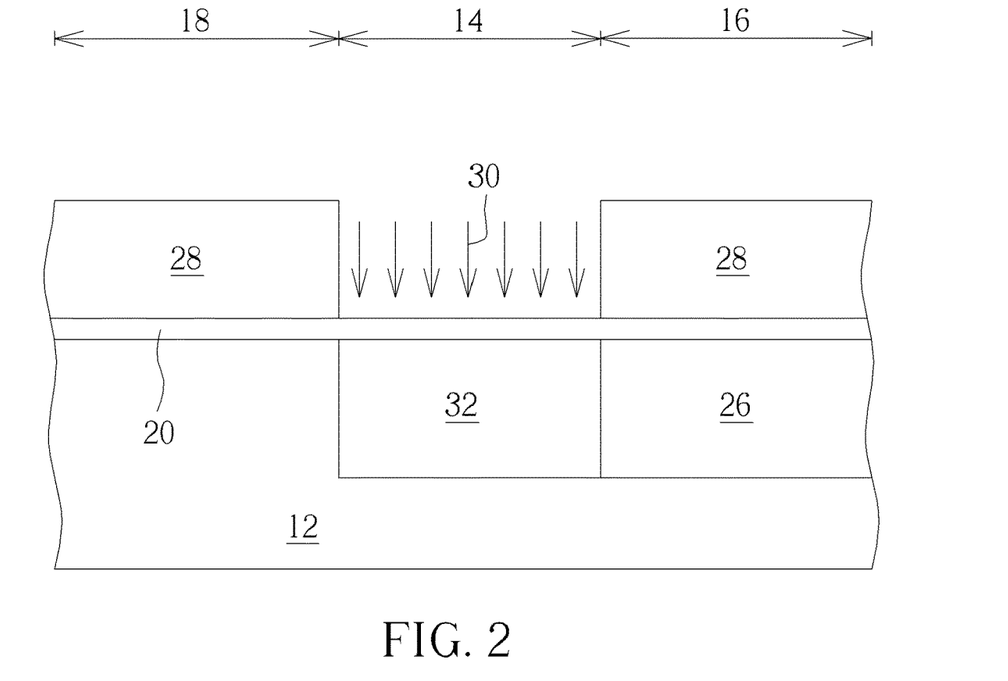

Next, as shown in FIG. 2, another patterned mask, such as a patterned resist 28 is formed on the pad layer 20 to cover the peripheral region 18 and the PMOS region 16, and another ion implantation process 30 is conducted by using the patterned resist 28 as mask to implant p-type dopants such as boron (B) into the substrate 12 on NMOS region 14 to form a first well or p-well 32.

Figure 3:
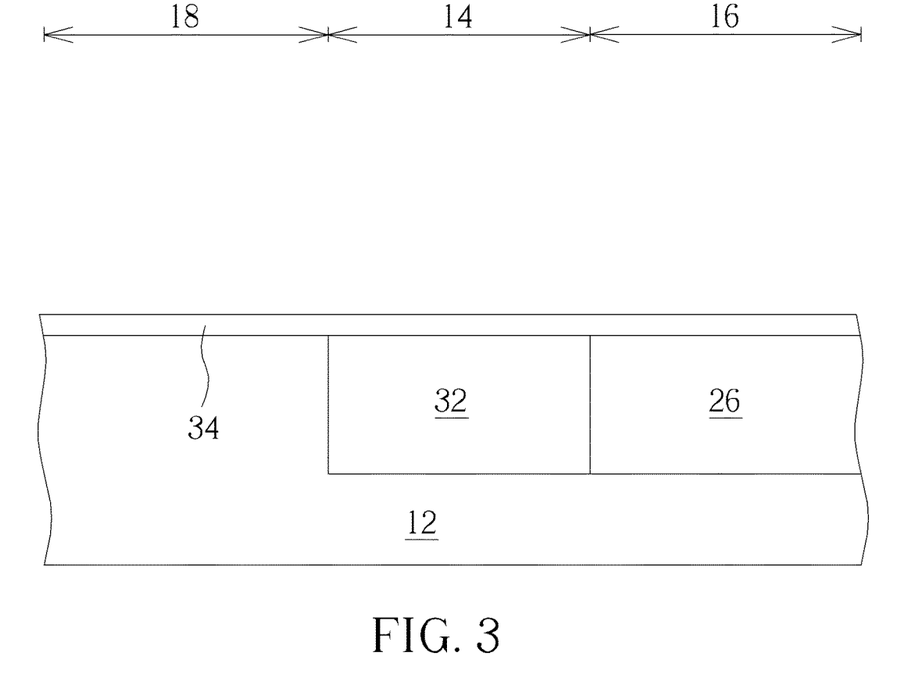

Next, as shown in FIG. 3, after stripping the patterned resist 28 to completely expose the surface of the pad layer 20 on NMOS region 14, PMOS region 16, and peripheral region 18, a thermal treatment process is conducted to activate the dopants implanted into the substrate 12. Next, the pad layer 20 is removed completely and another pad layer 34 also made of silicon oxide is formed on the surface of the substrate 12 on NMOS region 14, PMOS region 16, and peripheral region 18.

Figure 4:
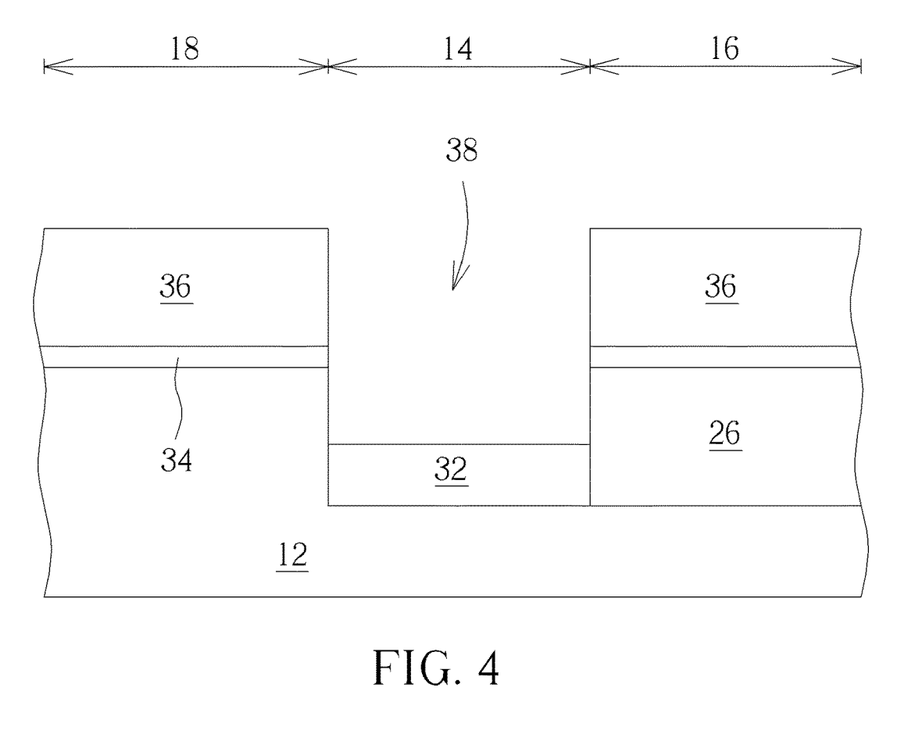

Next, as shown in FIG. 4, another patterned mask such as patterned resist 36 is formed on the pad layer 34 on peripheral region 18 and PMOS region 16, and an etching process is conducted by using the patterned resist 36 as mask to remove part of the pad layer 34 and part of the p-well 32 on the NMOS region 14 for forming a recess 38. In this embodiment, the etching process conducted to remove part of the pad layer 34 and part of the p-well 32 is preferably a dry etching process and etching gas used to conduct the dry etching process could include chlorine gas ($Cl_2$), hydrogen bromide (HBr), or combination thereof. The patterned resist 36 is stripped thereafter.

Figure 5:
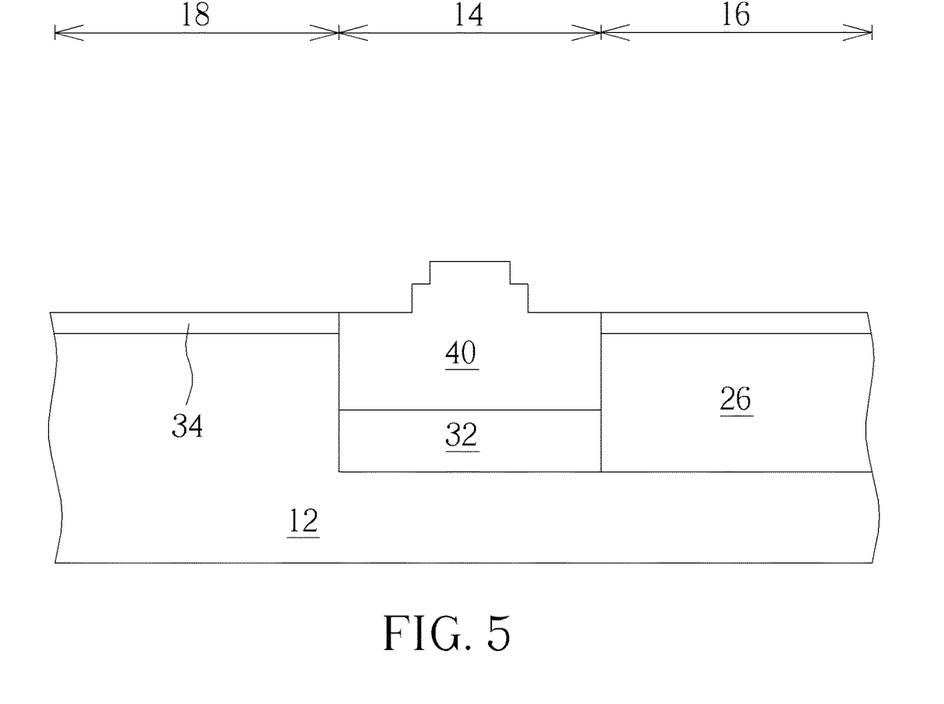

Next, as shown in FIG. 5, an epitaxial growth process is conducted to form an epitaxial layer 40 in the recess 38, in which the top surface of the epitaxial layer 40 is preferably higher than the top surfaces of the substrate 12 and the pad layer 34. In this embodiment, the epitaxial layer 40 is preferably an undoped epitaxial layer including but not limited to for example undoped silicon.

Figure 6:
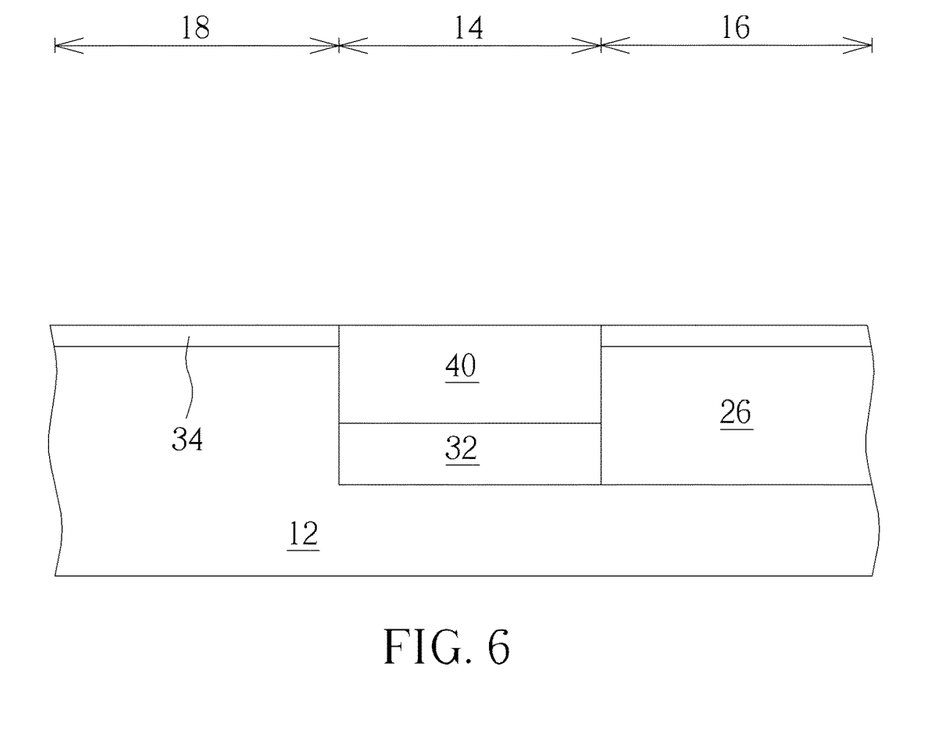

Next, as shown in FIG. 6, a planarizing process such as chemical mechanical polishing (CMP) process is conducted to remove part of the epitaxial layer 40 so that the top surface of the remaining epitaxial layer 40 is even with the top surface of the pad layer 34.

Figure 7:
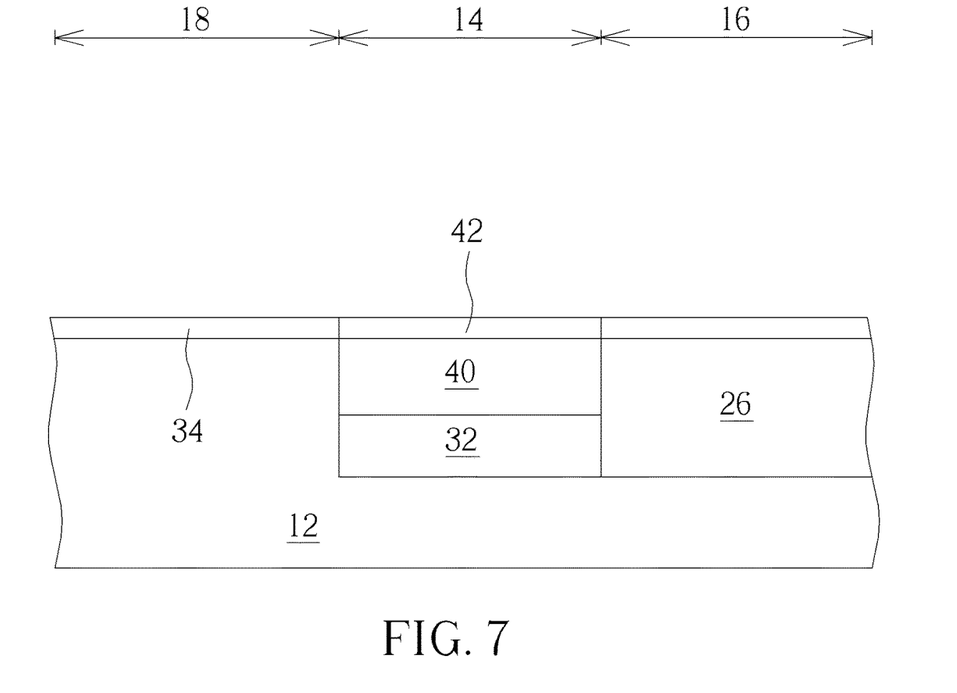

Next, as shown in FIG. 7, an oxidation process such as in-situ steam generation (ISSG) process is conducted to form an oxide layer 42 on the surface of the epitaxial layer 40 on NMOS region 14. Preferably, the oxide layer 42 and the adjacent pad layer 34 on the peripheral region 18 and PMOS region 16 are made of same material such as silicon dioxide and the top surface of the oxide layer 42 is preferably even with the top surface of the pad layer 34 on the adjacent peripheral region 18 and PMOS region 16.

Figure 8:
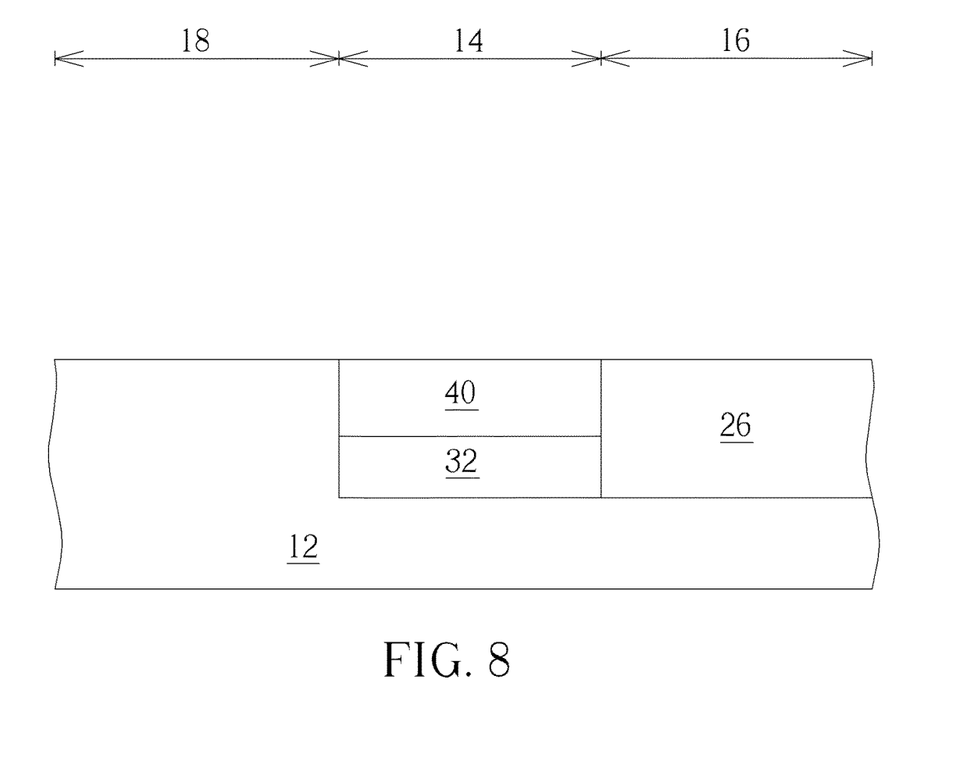

Next, as shown in FIG. 8, an etching process is conducted to completely remove the oxide layer 42 and pad layer 34 on the substrate, including the oxide layer 42 on NMOS region 14 and the pad layer 34 on peripheral region 18 and PMOS region 16. After removing the oxide layer 42 and the pad layer 34, the top surface of the exposed epitaxial layer 40 is preferably even with the top surface of the substrate 12 on peripheral region 18 and the top surface of n-well 26 on PMOS region 16.

Next, a patterned transfer or photo-etching process could be selectively conducted to remove part of the epitaxial layer 40 on the NMOS region 14 and part of the n-well 26 on PMOS region 16 for forming fin-shaped structures. After fin-shaped structures are formed, a shallow trench isolation (STI) could be formed between fin-shaped structures and then transistor fabrication process could be conducted depending on the demand of the product by forming transistor elements such as gate structures, spacers, and source/drain regions on the fin-shaped structures.

Figure 9:
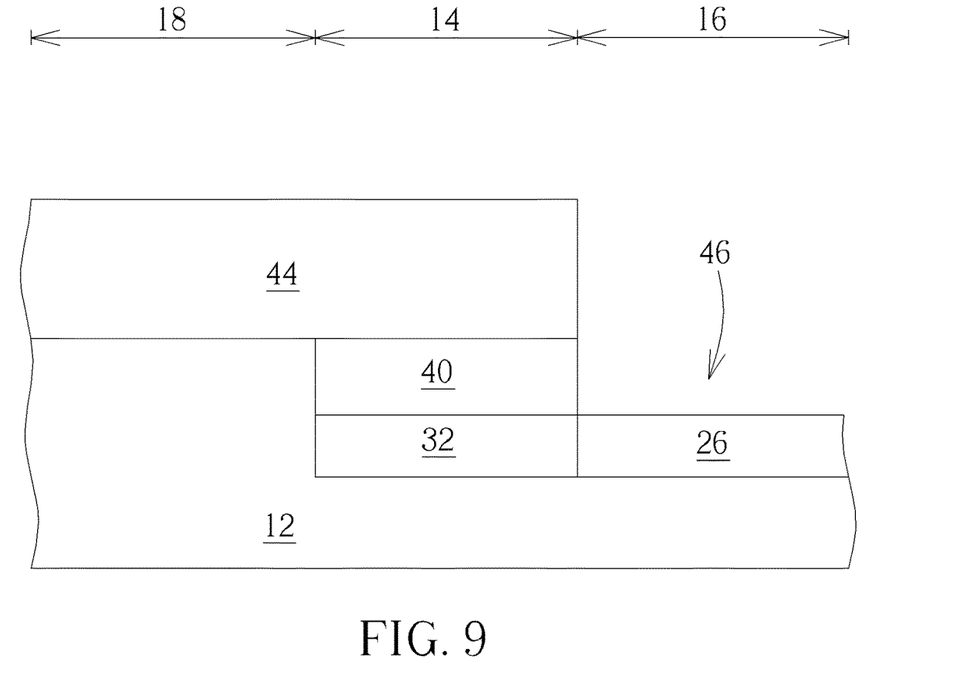

According to an embodiment of the present invention, as shown in FIG. 9, it would be desirable to selectively conduct another photo-etching process to form another epitaxial layer on the PMOS region 16 after removing the oxide layer 42 and pad layer 34 from the surface of the substrate 12 as shown in FIG. 8. For instance, a patterned mask such as a patterned resist 44 could be formed on the substrate on the NMOS region 14 and the peripheral region 18, and an etching process is conducted by using the patterned resist 44 as mask to remove part of the n-well 26 to form a recess 46, in which the bottom of the recess 46 is preferably even with the bottom of the epitaxial layer 40 or top surface of the p-well 32 on NMOS region 14.

Figure 10:
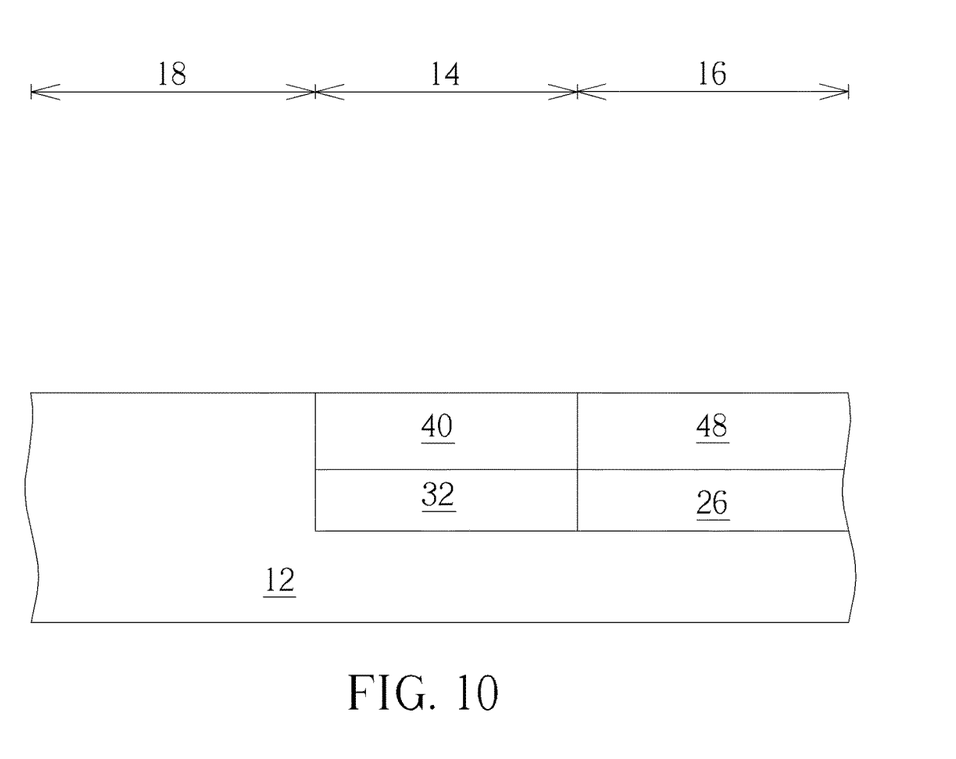

Next, as shown in FIG. 10, after stripping the patterned resist 44, an epitaxial growth process is conducted to form an epitaxial layer 48 in the recess 46, and a planarizing process such as CMP is conducted to remove part of the epitaxial layer 48 so that the top surface of the remaining epitaxial layer 48 is even with the top surface of the epitaxial layer 40 on NMOS region 14. Nevertheless, according to an embodiment of the present invention, it would also be desirable to form the epitaxial layer 48 while the patterned resist 44 is still disposed on the NMOS region 14 and peripheral region 18, strip the patterned resist 48, and then conduct the planarizing process to remove part of the epitaxial layer 48 so that the top surface of the remaining epitaxial layer 48 is even with the top surface of the epitaxial layer 40, which is also within the scope of the present invention. In this embodiment, the epitaxial layer 40 on NMOS region 14 and the epitaxial layer 48 on PMOS region 16 are preferably made of different materials. For instance, the epitaxial layer 48 on the PMOS region 48 is preferably an undoped epitaxial layer including but not limited to for example undoped silicon germanium (SiGe).

Figure 11:
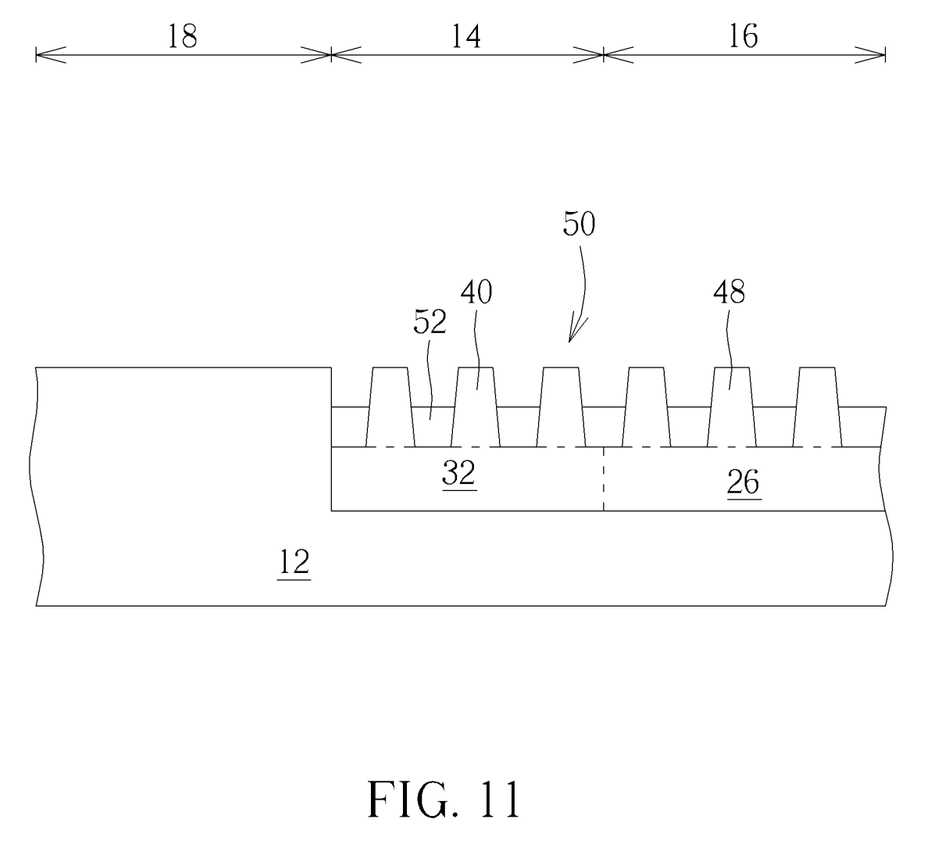

Next, as shown in FIG. 11, a pattern transfer or photo-etching process could be conducted to remove part of the epitaxial layers 40, 48 on NMOS region 14 and PMOS region 16 to form fin-shaped structures 50. Specifically, the formation of the fin-shaped structures 50 could be accomplished by first forming a patterned mask (not shown) on the peripheral region 18 and part of the epitaxial layers 40, 48, and then conducting an etching process to remove part of the epitaxial layer 40 on NMOS region 14 and part of the epitaxial layer 48 on PMOS region 16 to form fin-shaped structures 50. Next, a shallow trench isolation (STI) 52 preferably made of silicon oxide could be formed between the fin-shaped structures 50 and transistor fabrication could be conducted thereafter depending on the demand of the product to form transistor elements such as gate structures, spacers, and source/drain regions on the fin-shaped structures 50. This completes the fabrication of a semiconductor device according to an embodiment of the present invention.

It should be noted that the present embodiment preferably removes part of the epitaxial layer 40 and part of the epitaxial layer 48 while not removing any of the p-well 32 on NMOS region 14 and n-well 26 on PMOS region 16 to form the fin-shaped structures 50 so that the bottom surface of the fin-shaped structures 50 is preferably even with the top surface of the p-well 32 and n-well 26. Nevertheless, according to other embodiments of the present invention, it would also be desirable to remove part of the epitaxial layers 40, 48 without reaching the top surface of the p-well 32 and n-well 26 or remove part of the epitaxial layers 40, 48 and also part of the p-well 32 and part of the n-well 26. In other words, in contrast to the bottom surface of the fin-shaped structures 50 even with the top surfaces of the p-well 32 and n-well 26 disclosed in the aforementioned embodiment, the top surfaces of the p-well 32 and n-well 26 could be slightly higher than the bottom surface of the fin-shaped structures 50 and lower than the top surface of STI 52 or slightly lower than the bottom surface of the fin-shaped structures 50, which are all within the scope of the present invention and all of these variations for fabricating fin-shaped structures with different heights of the p-well 32 and n-well 26 could all be applied directly after the embodiment shown in FIG. 8 where no epitaxial layer was formed on the PMOS region 16.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    providing a substrate having a first region and a second region;
    forming a pad layer on the substrate;
    forming a first well in the substrate on the first region and a second well in the substrate on the second region;
    forming a first patterned mask on the pad layer;
    removing part of the pad layer and part of the first well to form a first recess before forming a gate structure, wherein a depth of the first recess below a top surface of the substrate is greater than half of a depth of the first well;
    removing the first patterned mask;
    forming a first epitaxial layer in the first recess;
    removing part of the first epitaxial layer to form fin-shaped structures on the first region, wherein a top surface of the fin-shaped structures is even with a top surface of the substrate;
    performing a planarizing process to remove part of the first epitaxial layer so that the top surfaces of the first epitaxial layer and the pad layer are coplanar; and
    removing the pad layer so that the top surfaces of the first epitaxial layer and the second well are coplanar.

2. The method of claim 1, wherein a top surface of the first epitaxial layer is higher than a top surface of the substrate.

3. The method of claim 1, further comprising:
    removing part of the first epitaxial layer, part of the first well, and part of the second well to form fin-shaped structures on the first region and the second region; and forming a shallow trench isolation (STI) between the fin-shaped structures.

4. The method of claim 1, further comprising:
forming a second patterned mask on the first region;
removing the pad layer on the second region and part of the second well to form a second recess;
removing the second patterned mask; and
forming a second epitaxial layer in the second recess.

5. The method of claim 4, further comprising:
removing part of the first epitaxial layer, part of the first well, part of the second epitaxial layer, and part of the second well to form fin-shaped structures on the first region and the second region; and
forming a shallow trench isolation (STI) between the fin-shaped structures.

6. The method of claim 4, wherein the first epitaxial layer and the second epitaxial layer comprise different material.

7. The method of claim 4, wherein the second epitaxial layer comprises an undoped epitaxial layer.

8. The method of claim 7, wherein the second epitaxial layer comprises undoped silicon germanium.

9. The method of claim 1, wherein the first epitaxial layer comprises an undoped epitaxial layer.

10. The method of claim 9, wherein the first epitaxial layer comprises undoped silicon.

11. The method of claim 1, wherein the first region comprises a NMOS region and the second region comprises a PMOS region.

12. The method of claim 1, wherein the first well comprises a p-well and the second well comprises a n-well.

13. A method for fabricating semiconductor device, comprising:
providing a substrate having a first region and a second region;
forming a first well in the substrate on the first region and a second well in the substrate on the second region;
removing part of the first well to form a first recess before forming any gate structure, wherein a depth of the first recess below a top surface of the substrate is greater than half of a depth of the first well;
forming a first epitaxial layer in the first recess; and
removing part of the first epitaxial layer to form fin-shaped structures on the first region, wherein a top surface of the fin-shaped structures is even with a top surface of the substrate.

* * * * *